(12) United States Patent
Kawaguchi et al.

(10) Patent No.: US 10,343,312 B2
(45) Date of Patent: Jul. 9, 2019

(54) IMPRINT DEVICE AND IMPRINT METHOD

(71) Applicant: SCIVAX CORPORATION, Kanagawa (JP)

(72) Inventors: Hirosuke Kawaguchi, Tokyo (JP); Tatsuya Hagino, Kanagawa (JP); Satoru Tanaka, Tokyo (JP)

(73) Assignee: SCIVAX CORPORATION, Kanagawa (JP)

( * ) Notice: Subject to any disclaimer, the term of this patent is extended or adjusted under 35 U.S.C. 154(b) by 703 days.

(21) Appl. No.: 14/407,510

(22) PCT Filed: Aug. 23, 2013

(86) PCT No.: PCT/JP2013/072620
§ 371 (c)(1),
(2) Date: Dec. 12, 2014

(87) PCT Pub. No.: WO2014/034576
PCT Pub. Date: Mar. 6, 2014

(65) Prior Publication Data
US 2015/0158239 A1     Jun. 11, 2015

(30) Foreign Application Priority Data

Aug. 27, 2012  (JP) .................................. 2012-186133

(51) Int. Cl.
*B29C 59/02*     (2006.01)
*B29C 43/10*     (2006.01)
(Continued)

(52) U.S. Cl.
CPC .............. *B29C 43/10* (2013.01); *B29C 43/12* (2013.01); *B29C 43/36* (2013.01); *B29C 59/02* (2013.01);
(Continued)

(58) Field of Classification Search
CPC .... B29C 2043/3233; B29C 2043/3652; B29C 2043/3613; B29C 43/10; B29C 43/12
See application file for complete search history.

(56) References Cited

U.S. PATENT DOCUMENTS

| 2,180,795 | A | 10/1937 | Christensen |
| 5,024,819 | A | 6/1991 | Dinter et al. |
| (Continued) | | | |

FOREIGN PATENT DOCUMENTS

| JP | 3-280229 | 12/1991 |
| JP | 2006-018977 | 1/2006 |
| (Continued) | | |

OTHER PUBLICATIONS

Office Action from U.S. Appl. No. 14/377,934 dated Sep. 7, 2017, 30 pages.

*Primary Examiner* — Atul P. Khare
(74) *Attorney, Agent, or Firm* — Schroeder Intellectual Property Law Group, LLC

(57) ABSTRACT

An imprint device and an imprint method which form mold patterns on both surfaces of a molding target. An imprint device transfers mold patterns on both surfaces of a molding target using flexible first and second dies and includes first and second casings which each apply pressure of first and second pressurizing rooms respectively, to the first and second dies respectively and the molding target, a pressurizer that adjusts the pressures of the pressurizing rooms, first and second moving units that move the first and second dies respectively and the molding target in a direction coming close to or distant from each other, a depressurizer that depressurizes a depressurizing room formed between the first and second casings, and eliminates fluids present between the dies and the molding target, and a pressure adjuster that adjusts pressures to reduce pressure differences (Continued)

between the depressurizing room and the pressurizing rooms.

11 Claims, 5 Drawing Sheets

(51) Int. Cl.
    *B29D 11/00*     (2006.01)
    *B29C 43/12*     (2006.01)
    *B82Y 40/00*     (2011.01)
    *G03F 7/00*     (2006.01)
    *B29C 43/36*     (2006.01)
    *B29C 43/02*     (2006.01)
    *B29C 43/32*     (2006.01)
    *B29C 51/28*     (2006.01)

(52) U.S. Cl.
    CPC ........ *B29D 11/00336* (2013.01); *B82Y 40/00* (2013.01); *G03F 7/0002* (2013.01); *B29C 51/28* (2013.01); *B29C 2043/025* (2013.01); *B29C 2043/3233* (2013.01); *B29C 2043/3605* (2013.01); *B29C 2043/3647* (2013.01); *B29C 2043/3652* (2013.01); *B29C 2059/023* (2013.01); *B29C 2791/006* (2013.01); *B29C 2791/007* (2013.01); *B29D 11/00* (2013.01)

(56) References Cited

U.S. PATENT DOCUMENTS

| | | | |
|---|---|---|---|
| 5,078,947 A | 1/1992 | Nishizawa et al. | |
| 5,242,731 A | 9/1993 | Shimizu et al. | |
| 5,623,368 A | 4/1997 | Calderini et al. | |
| 5,669,303 A | 9/1997 | Maracas et al. | |
| 5,937,758 A | 8/1999 | Maracas et al. | |
| 5,947,027 A | 9/1999 | Burgin et al. | |
| 7,144,539 B2* | 12/2006 | Olsson | B29C 43/021 264/293 |
| 7,252,492 B2* | 8/2007 | Olsson | B29C 59/022 33/1 M |
| 7,363,854 B2* | 4/2008 | Sewell | B82Y 10/00 101/41 |
| 7,754,131 B2* | 7/2010 | Olsson | B29C 59/022 264/106 |
| 7,798,802 B2* | 9/2010 | Cho | B82Y 10/00 425/174.4 |
| 8,083,514 B2* | 12/2011 | Chuang | B29C 35/007 425/384 |
| 8,186,992 B2* | 5/2012 | Washiya | B29C 43/021 264/293 |
| 8,215,944 B2* | 7/2012 | Takaya | B29C 59/022 264/293 |
| 8,377,361 B2* | 2/2013 | Zhang | B29C 59/022 264/293 |
| 8,633,052 B2* | 1/2014 | Polito | B29C 43/021 438/71 |
| 8,764,431 B2* | 7/2014 | Yamashita | B82Y 10/00 264/293 |
| 9,606,431 B2* | 3/2017 | Kawaguchi | B29C 59/02 |
| 2004/0131718 A1 | 7/2004 | Chou et al. | |
| 2005/0172848 A1* | 8/2005 | Olsson | B81C 1/0046 101/493 |
| 2006/0006580 A1 | 1/2006 | Olsson et al. | |
| 2006/0038309 A1 | 2/2006 | Korenaga et al. | |
| 2006/0272535 A1 | 12/2006 | Seki et al. | |
| 2007/0035056 A1 | 2/2007 | Suehira et al. | |
| 2007/0035717 A1 | 2/2007 | Wu et al. | |
| 2007/0114696 A1 | 5/2007 | Miyakoshi | |
| 2007/0134362 A1 | 6/2007 | Heidari | |
| 2007/0278712 A1 | 12/2007 | Okushima et al. | |
| 2008/0229948 A1 | 9/2008 | Washiya et al. | |
| 2009/0026658 A1 | 1/2009 | Hosoda et al. | |
| 2010/0255139 A1* | 10/2010 | Washiya | B29C 43/021 425/405.1 |
| 2011/0024948 A1* | 2/2011 | Takaya | B29C 59/022 264/293 |
| 2011/0217479 A1 | 9/2011 | Yamashita et al. | |
| 2011/0273684 A1 | 11/2011 | Owa et al. | |
| 2011/0298159 A1 | 12/2011 | Jang et al. | |
| 2015/0042013 A1* | 2/2015 | Kawaguchi | B29C 59/02 264/293 |

FOREIGN PATENT DOCUMENTS

| | | | | |
|---|---|---|---|---|
| JP | 2006018977 A | * | 1/2006 | |
| JP | 2008155521 A | * | 7/2008 | |
| JP | 2008-221706 | | 9/2008 | |
| JP | 2008-230027 | | 10/2008 | |
| JP | 2008-254350 A | | 10/2008 | |
| JP | 2009-154393 | | 7/2009 | |
| JP | 2010-507230 | | 3/2010 | |
| JP | 2011-211157 A | | 10/2011 | |
| WO | 2004/062886 | | 7/2004 | |
| WO | 2012/147958 | | 11/2012 | |
| WO | WO-2012147958 A1 | * | 11/2012 | B29C 59/02 |
| WO | WO-2012165310 A1 | * | 12/2012 | G11B 5/855 |
| WO | WO-2013035759 A1 | * | 3/2013 | B29C 59/02 |

* cited by examiner

IMPRINT DEVICE AND IMPRINT METHOD

RELATED APPLICATIONS

This application is a national phase of International Patent Application No. PCT/JP2013/072620, filed Aug. 23, 2013, which claims the filing benefit of Japanese Patent Application No. 2012-186133, filed Aug. 27, 2012, the contents of both of which are incorporated herein by reference.

TECHNICAL FIELD

The present disclosure relates to an imprint device and an imprint method that transfer mold patterns to both surfaces of a molding target using flexible first and second dies.

BACKGROUND ART

Conventionally, a nano-imprinting technology is known to form a micropattern in a micro order or a nano order. This technology is to depress a die with a microscopic mold pattern against a molding target like a resin, and to transfer the pattern to the molding target by heat or light (see, for example, Patent Literature 1). In addition, an imprint device is also known which depresses a flexible die or stage with a fluid pressure in order to increase the transfer area (see, for example, Patent Literature 2).

CITATION LIST

Patent Literature

Patent Literature 1: WO2004/062886
Patent Literature 2: JP 2009-154393 A

SUMMARY OF INVENTION

Technical Problem

Recently, a formation of a MOTH-EYE structure on both cured faces of a lens has been desired, and a device that can from a microstructure on both curved faces at one time is also desired.

Therefore, it is an objective of the present disclosure to provide an imprint device and an imprint method which can form mold patterns on both surfaces of a molding target at one time.

Solution to Problem

In order to accomplish the above objective, an imprint device of the present disclosure transfers mold patterns on both surfaces of a molding target using flexible first and second dies, and the device includes: a first casing that comprises a first pressurizing room, and applies pressure of the first pressurizing room to the first die and the molding target; a second casing that comprises a second pressurizing room, and applies pressure of the second pressurizing room to the second die and the molding target; a pressurizer that adjusts the pressure of the first pressurizing room and the pressure of the second pressurizing room; a first moving unit that moves the first die and the molding target in a direction coming close to or distant from each other; a second moving unit that moves the second die and the molding target in a direction coming close to or distant from each other; a depressurizer that depressurizes a depressurizing room formed between the first casing and the second casing, and eliminates fluids present between the first die and the molding target and between the second die and the molding target; and a pressure adjuster that adjusts pressures so as to reduce pressure differences between the depressurizing room and the first pressurizing room and between the depressurizing room and the second pressurizing room are reduced when the depressurizing room is depressurized.

In this case, it is preferable that the pressure adjuster should be capable of reducing a pressure difference between the first pressurizing room and the second pressurizing room when the first and second pressurizing rooms are pressurized. In addition, it is preferable that the pressure adjuster includes a communication channel that causes the depressurizing room to be in communication with the first pressurizing room and the second pressurizing room.

It is preferable that the first moving unit should include a frame that surrounds an outer circumference of the second casing, and be capable of holding the first die with the first casing.

It is preferable that the first moving unit should apply elastic force in a direction in which the first die and the molding target become distant from each other, the second moving unit should apply elastic force in a direction in which the second die and the molding target become distant from each other, and the imprint device should further include a casing moving unit that moves the first casing and the second casing relative to each other against the elastic forces of the first moving unit and the second moving unit.

The imprint device may further include a molding target holder that holds a circumference of the molding target, in which the second moving unit may move the molding target holder holding the molding target relative to the second casing.

The imprint device may further include a first sealer that air-tightly seals a space between the first pressurizing room and the first die, a second sealer that air-tightly seals a space between the second pressurizing room and the second die, and a depressurizing room sealer that air-tightly seals an interior of the depressurizing room.

The imprint device may further include flexible films disposed between the first pressurizing room and the first die and between the second pressurizing room and the second die, respectively.

The imprint device may further include a temperature adjuster that adjusts a temperature of the molding target, and a light source that emits light to the molding target.

An imprint method according to the present disclosure is for transferring mold patterns on both surfaces of a molding target using flexible first and second dies, and the method includes: a disposing process of forming a first pressurizing room between a first casing and the first die, forming a second pressurizing room between a second casing and the second die, and forming a depressurizing room between the first die and the molding target and between the second die and the molding target; an eliminating process of depressurizing the depressurizing room, the first pressurizing room, and the second pressurizing room, and eliminating fluids present between the first die and the molding target and between the second die and the molding target; an intimately contacting process of causing the first die and the second die to intimately contact the molding target; and a transferring process of pressurizing the first pressurizing room and the second pressurizing room and transferring the mold pattern of the first die and the mold pattern of the second die to the molding target.

In this case, in the transferring process, the first die and the second die may be depressed against the molding target, and the molding target may be irradiated with light having a predetermined wavelength, or the molding target may be heated to a temperature equal to or higher than a glass transition temperature, and the first die and the second die may be depressed against the molding target.

Advantageous Effects of Invention

Since the imprint device and imprint method of the present disclosure perform transferring after eliminating gases present between a first die and a molding target and between a second die and the molding target. Hence, mold patterns can be surely formed on both surfaces of the molding target at one time.

It is to be understood that the aspects and objects of the present invention described above may be combinable and that other advantages and aspects of the present invention will become apparent upon reading the following description of the drawings and detailed description of the invention.

DESCRIPTION OF EMBODIMENTS

Figure 1:
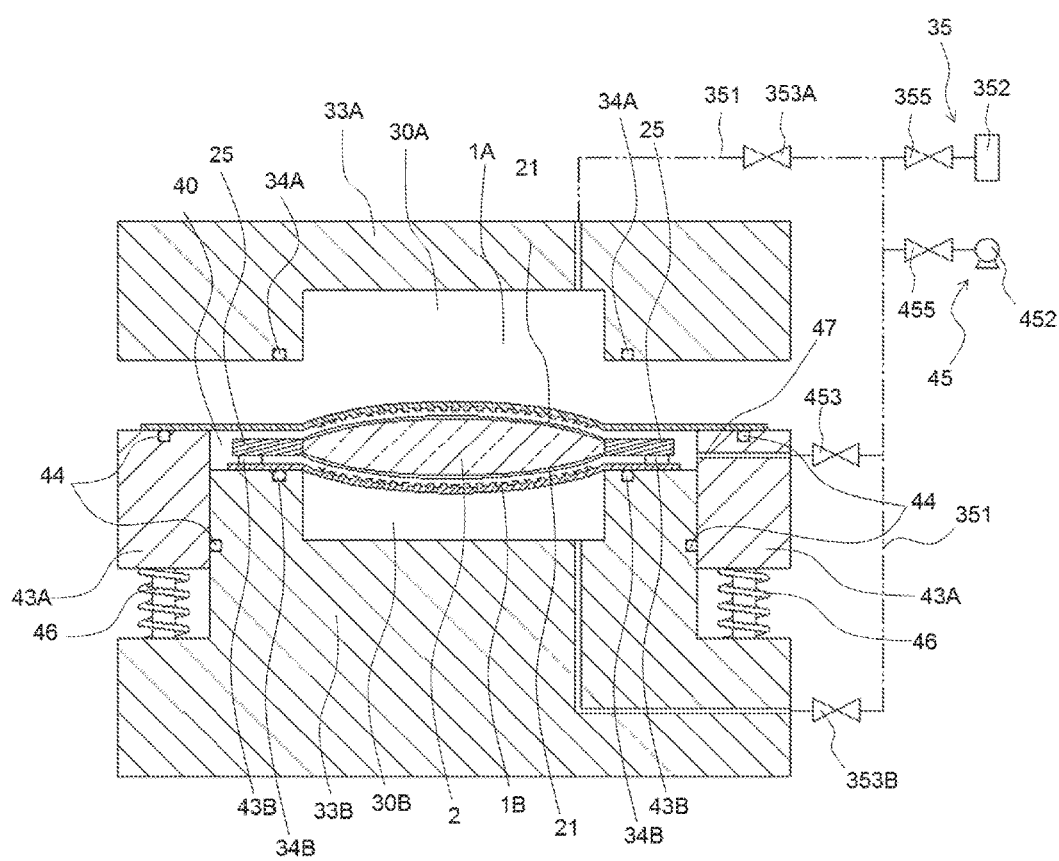
FIG. 1 is a cross-sectional view illustrating an imprint device according to the present disclosure.

While this invention is susceptible of embodiment in many different forms, there is shown in the drawings and will herein be described in detail one or more embodiments with the understanding that the present disclosure is to be considered as an exemplification of the principles of the invention and is not intended to limit the invention to the embodiments illustrated.

An imprint device of the present disclosure transfers, as illustrated in FIGS. 1 to 5, mold patterns on both surfaces of a molding target 2 using flexible first and second dies 1A, 1B. The imprint device includes a first casing 33A which includes a first pressurizing room 30A and which applies the pressure of the first pressurizing room 30A to the first die 1A and the molding target 2, a second casing 33B which includes a second pressurizing room 30B and which applies the pressure of the second pressurizing room 30B to the second die 1B and the molding target 2, a pressurizer 35 that adjusts the pressure of the first pressurizing room 30A and that of the second pressurizing room 30B, a first moving unit that can move the first die 1A and the molding target 2 in directions coming close to each other and becoming distant from each other, a second moving unit that can move the second die 1B and the molding target in directions coming close to each other and becoming distant from each other, a depressurizing room 40 formed between the first casing 33A and the second casing 33B, a depressurizes 45 that depres-
surizes the depressurizing room 40 to eliminate fluids present between the first die 1A and the molding target 2 and between the second die 1B and the molding target 2, and a pressure adjuster that adjusts the pressures of the depressurizing room 40, the first pressurizing room 30A and the second pressurizing room 30B so as to reduce the pressure difference between the depressurizing room and the first and second pressurizing rooms.

Note that in this specification, the first die 1A and the second die 1B are each a flexible material like a resin film, and having a predetermined mold pattern formed on one surface (molding surface). This mold pattern can be formed by imprinting technologies, or semiconductor microfabrication technologies like etching.

Needless to say, the material, manufacturing method, etc., of the first and second dies 1A, 1B are not limited to any particular ones as long as the mold pattern is transferrable.

The mold pattern formed on the first or second die 1A, 1B is not limited to a geometrical shape with concavities and convexities, but includes, for example, a transfer of a predetermined surface condition like a transfer of a mirror condition with a predetermined surface roughness. In addition, the mold pattern can be formed in various sizes such that the minimum dimension of the width of the concavity and that of the convexity in the planar direction is equal to or smaller than 100 μm, equal to or smaller than 10 μm, equal to or smaller than 2 μm, equal to or smaller than 1 μm, equal to or smaller than 100 nm, and equal to or smaller than 10 nm. Still further, the dimension in the depthwise direction can be also formed in various sizes, such as equal to or larger than 10 nm, equal to or larger than 100 nm, equal to or larger than 200 nm, equal to or larger than 500 nm, equal to or larger than 1 μm, equal to or larger than 10 μm, and equal to or larger than 100 μm.

The shape of the molding surfaces of the first and second dies 1A, 1B is not limited to a planar shape. For example, like the die to transfer a MOTH-EYE structure on the curved face of a lens, the molding surface may be in a three-dimensional shape like a curved face.

The molding target 2 means one including a substrate or a film which is formed of a resin, an inorganic compound or a metal, and which has a molding target layer 21 formed on the substrate or the film, but may be simply a substrate itself or a flexible film. The shape of the molded surface is not limited to a planar shape. For example, like a lens, the molded surface may be in a three-dimensional shape like a curved face. In addition, molding target layers with fluidity may be formed on the first and second dies 1A, 1B, and the molding target layers may be joined with the substrate when the substrate and the first and second dies 1A, 1B are depressed. An example material of the molding target 2 is a photo-curable resin, a thermosetting resin, a thermoplastic resin, or an inorganic polymer.

Example thermoplastic resins are olefin-based resins, such as cyclic-olefin ring-open polymer/hydrogen added substance (COP) and cyclic-olefin copolymer (COC), an acrylic resin, polycarbonate, a vinyl-ether resin, fluorine resins, such as perfluoroalkoxyalkane (PFA) or polytetrafluoroethylene (PTFE), polystyrene, a polyimide-based resin, and a polyester-based resin.

Example photo-curable resin or thermosetting resin is epoxide-containing compounds, (metha) acrylate ester compounds, or unsaturated hydrocarbon-radial containing compounds of vinyl radial and allyl radial, such as vinyl ether compounds, bisallylnadimide compounds. In this case, for the purpose of a thermal polymerization, a polymerization reaction radial containing compound can be applied in solo, or an initiator with a thermal reactivity may be added to improve the thermal curing characteristics. In addition, a photoreactive initiator may be added to let a polymerization reaction advanced upon irradiation with light, thereby forming a mold pattern. Example radial initiators with a thermal reactivity suitable are organic peroxide and azo compound, and example photoreactive radial initiators suitable are acetophenone derivative, benzophenone derivative, benzoin ether derivative, and xanthone derivative. The reactive monomer may be utilized in a solventless form, or may be dissolved in a solvent and desolvated after application.

An example inorganic polymer is a poly-silazane compound.

Figure 2:
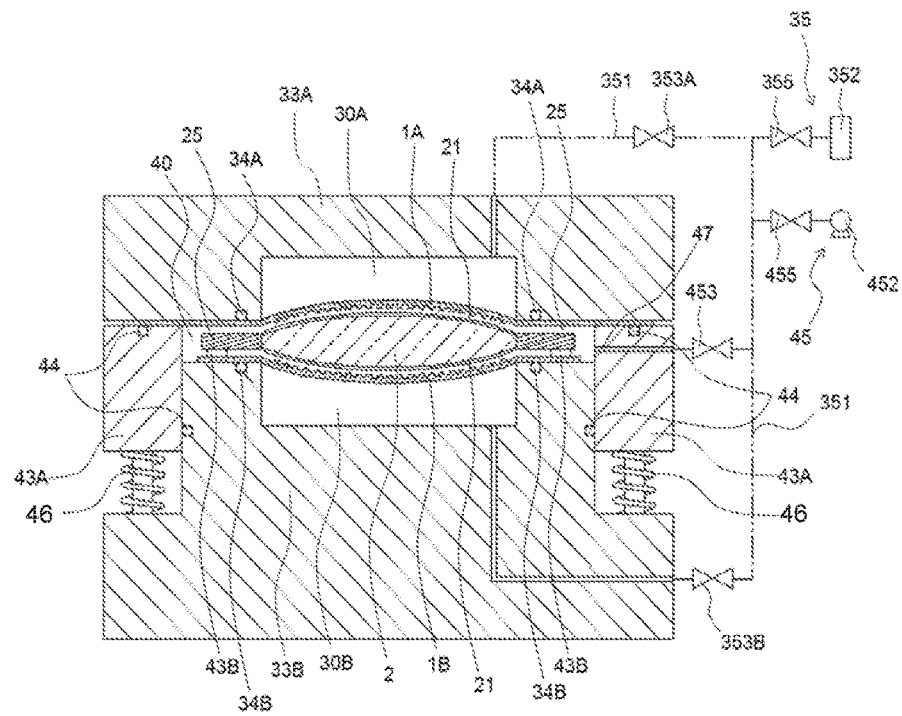
FIG. 2 is a cross-sectional view illustrating the imprint device of the present disclosure at the time of depressurization.
Figure 3:
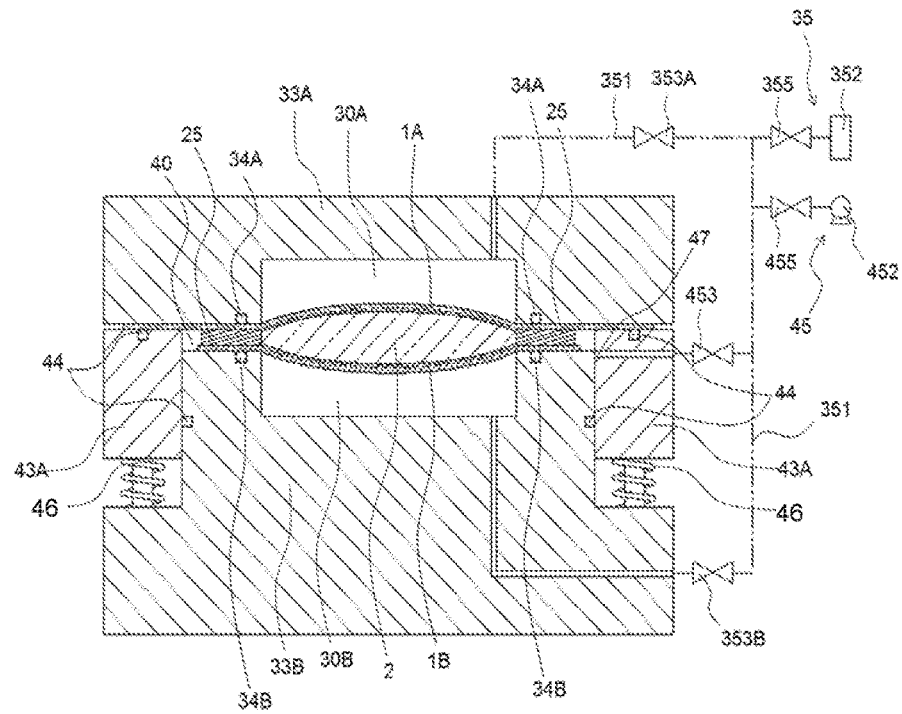
FIG. 3 is a cross-sectional view illustrating the imprint device of the present disclosure at the time of molding.

Note that in FIGS. 1 to 3, the expected molding target 2 is a photo-curable resin film 21 applied on a lens surface.

Figure 6:
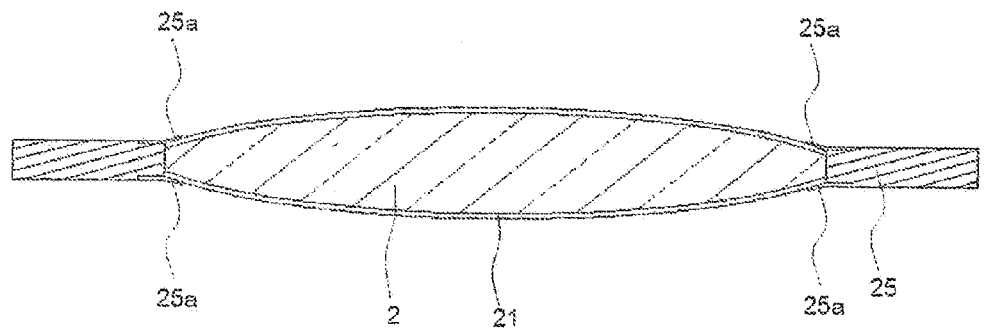
FIG. 6 is a cross-sectional view illustrating a molding target holder according to the present disclosure.

Depending on the shape of the molding target 2, as illustrated in FIG. 6, a molding target holder 25 may be applied which holds the circumference of the molding target 2. When, for example, the molding target 2 is a lens, the molding target holder includes a doughnut-like disk with a predetermined thickness having a hole with the substantially same shape as that of the lens, and flexible supports 25*a* which are formed at the upper and lower end portions of the hole. The lens can be fitted in this hole to hold the lens. The supports 25*a* also serve to prevent the first and second dies 1A, 1B from being damaged by the edge of the molding target holder 25 and that of the molding target 2. The material of the support 25*a* is not limited to any particular one as long as it can prevent the first and second dies 1A, 1B from being damaged, but for example, a resin like polytetrafluoroethylene is applicable. When the molding target holder 25 employs such a structure, it becomes possible to easily handle the molding target 2. Note that the second moving unit to be discussed later may move the molding target holder 25 holding the molding target 2 relative to a second casing.

Figure 4:
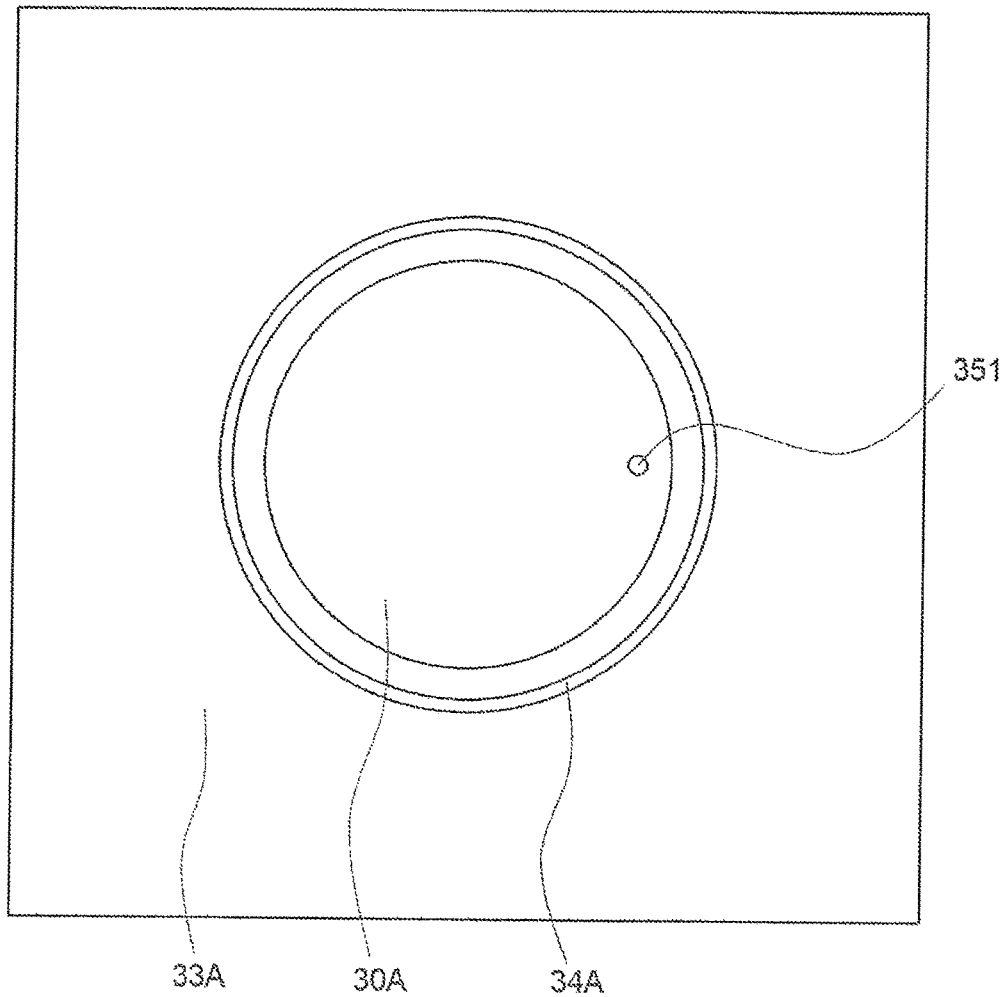
FIG. 4 is a plan view illustrating a first casing according to the present disclosure.

The first casing 33A is to form the first pressurizing room 30A that directly or indirectly depresses the first die 1A and the molding target 2 by a fluid. For example, as illustrated in FIGS. 1 and 4, the first casing 33A is formed in a cylindrical shape with a bottom and with an opened end, and when the opened end is closed by the first die 1A, the first pressurizing room 30A that is an air-tightly sealed space is formed. This opened end is formed larger than at least the molding surface of the first die 1A.

FIGS. 2 and 3 illustrate an example case in which the first pressurizing room 30A is formed by the first casing 33A and the first die 1A. Hence, the first die 1A can be directly depressed against the molding target 2 by a fluid. The material of the first casing 33A is not limited to any particular one as long as it has the pressure resistance and the heat resistance under the molding condition in an imprinting process, and for example, a metal like stainless-steel is applicable.

In order to surely seal the first pressurizing room 30A, a first sealer 34A to air-tightly seal a space between the first casing 33A and the first die 1A may be further provided. For example, as illustrated in FIG. 2, the first sealer 34A that is an O-ring is prepared, a concave groove shallower than the diameter of the cross-section of the O-ring is formed in the portion of the first casing 33A that abuts the first die 1A, and the O-ring can be disposed in this groove. Hence, the first die 1A can be held by the first casing 33A and the molding target holder 25, and the first die 1A can be intimately in contact with the first casing 33A, and thus the first pressurizing room 30A can be air-tightly sealed. The O-ring may be disposed in such a way that the first die 1A is held by the first casing 33A and a frame 43A.

Figure 7:
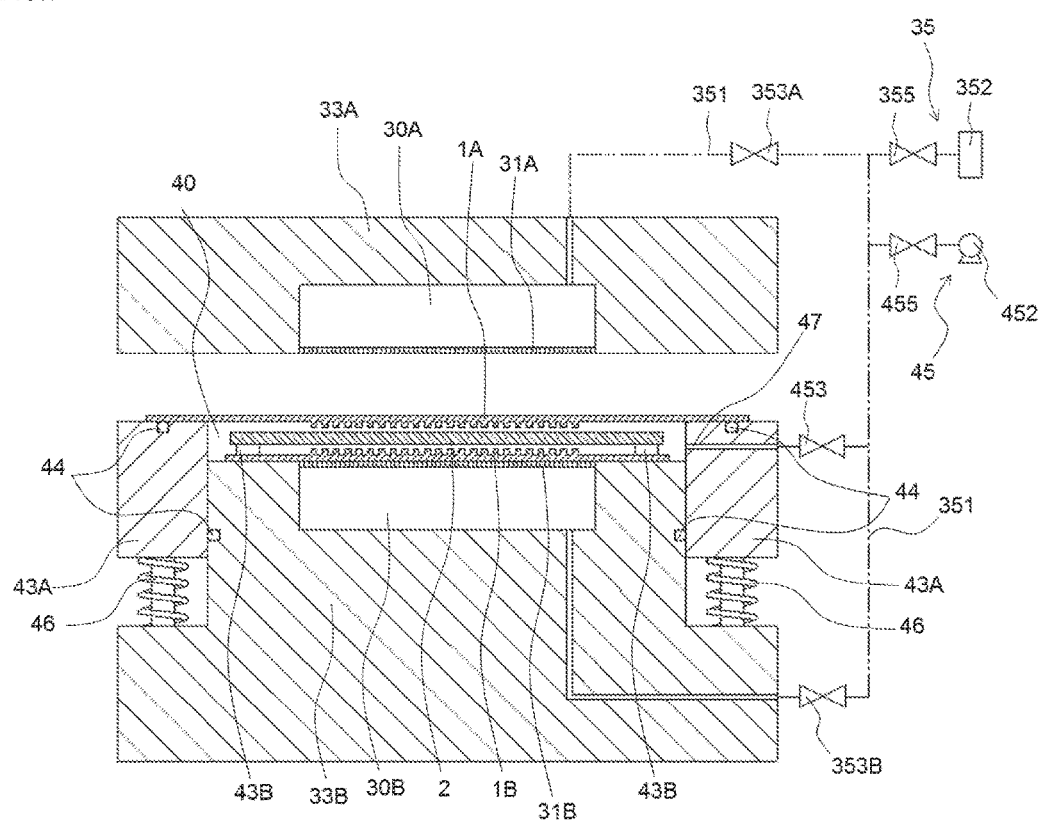
FIG. 7 is a cross-sectional view illustrating another imprint device according to the present disclosure.

As another example, as illustrated in FIG. 7, the first pressurizing room 30A may be formed by the first casing 33A formed in a cylindrical shape with a bottom and with an opened end, and a flexible film 31A that closes the opened end. Accordingly, the first die 1A can be indirectly depressed against the molding target 2 by a fluid through the film 31A. Example materials of the film 31A are a resin, a thin metal, and an elastic body like rubber. When a light source that emits light with a predetermined wavelength to the molding target 2 is provided at the first-pressurizing-room-30A side, a light transmissive material is selected for the film 31A. The film 31A can have an arbitrary thickness as long as it is flexible, but is formed in equal to or smaller than 10 mm, preferably, equal to or smaller than 3 mm, more preferably, equal to or smaller than 1 mm. The first casing 33A and the film 31A may be fixed by an adhesive, etc., to air-tightly seal the interior of the first pressurizing room 30A. The first casing 33A and the film 31A may be separate components, and the space between the first casing 33A and the film 31A may be sealed by the above-explained first sealer 34A.

Figure 5:
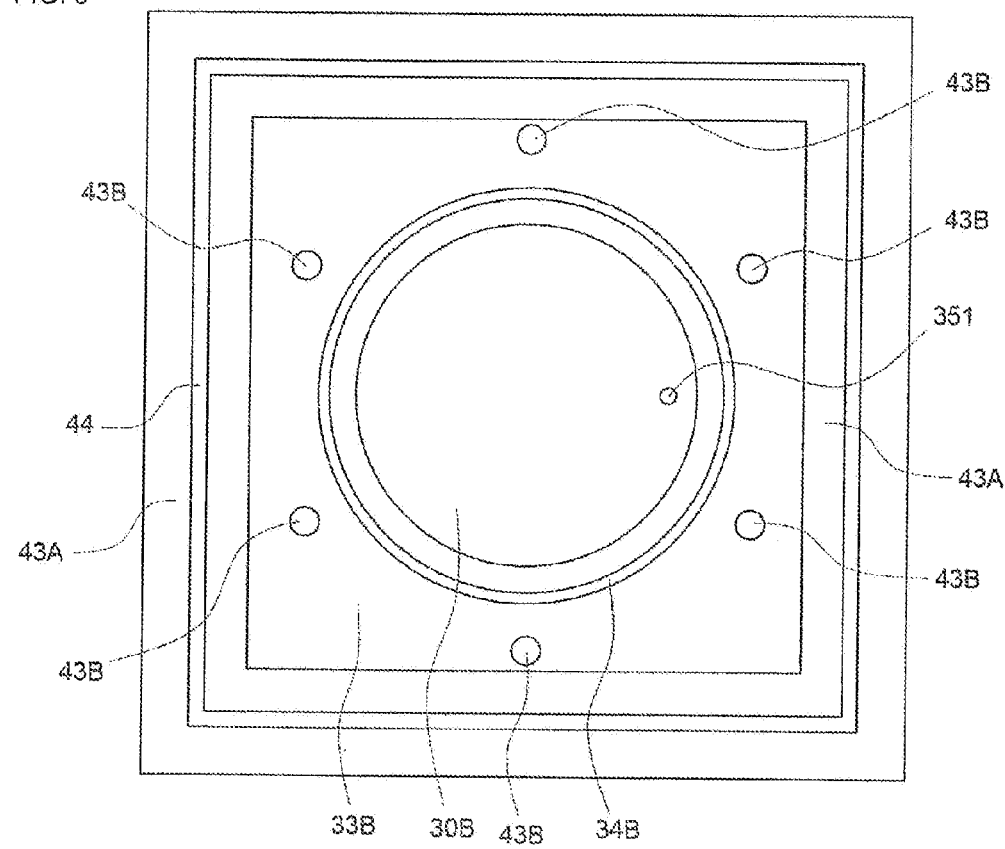
FIG. 5 is a plan view illustrating a second casing and a frame according to the present disclosure.

The second casing 33B is to form the second pressurizing room 30B that directly or indirectly depresses the second die 13 and the molding target 2 by a fluid, and is disposed at the opposite side to the first casing 33A. For example, as illustrated in FIGS. 1 and 5, the second casing 33B is formed in a cylindrical shape with a bottom and with an opened end, and when the opened end is closed by the second die 13, the second pressurizing room 30B that is an air-tightly sealed space is formed. This opened end is formed larger than at least the molding surface of the second die 1B.

FIGS. 2 and 3 illustrate an example case in which the second pressurizing room 30B is formed by the second casing 33B and the second die 1B. Hence, the second die 1B can be directly depressed against the molding target 2 by a fluid. The material of the second casing 33B is not limited to any particular one as long as it has the pressure resistance and the heat resistance under the molding condition in an imprinting process, and for example, a metal like stainless-steel is applicable.

In order to surely seal the second pressurizing room 30B, a second sealer 34B to intimately seal a space between the second casing 33B and the second die 1B may be further provided. For example, as illustrated in FIG. 2, the second sealer 34B that is an O-ring is prepared, a concave groove shallower than the diameter of the cross-section of the O-ring is formed in the portion of the second casing 33B that abuts the second die 13, and the O-ring can be disposed in this groove. Hence, the second die 1B can be held by the second casing 33B and the molding target holder 25, and the second die 1B can be intimately in contact with the second casing 33B, and thus the second pressurizing room 303 can be air-tightly sealed. The O-ring may be disposed in such a way that the second die 1B is held by the second casing 33B and the frame 43A.

As another example, as illustrated in FIG. 7, the second pressurizing room 303 may be formed by the second casing 33B formed in a cylindrical shape with a bottom and with an opened end, and a flexible film 31B that closes the opened end. Accordingly, the second die 1B can be indirectly depressed against the molding target 2 by a fluid through the film 31B. Example materials of the film 31B are a resin, a thin metal, and an elastic body like rubber. When a light source that emits light with a predetermined wavelength to the molding target 2 is provided at the second-pressurizingroom-30B side, a light transmissive material is selected for the film 31B. The film 31B can have an arbitrary thickness as long as it is flexible, but is formed in equal to or smaller than 10 mm, preferably, equal to or smaller than 3 mm, more preferably, equal to or smaller than 1 mm. The second casing 33B and the film 31B may be fixed by an adhesive, etc., to air-tightly seal the interior of the second pressurizing room 30B. The second casing 33B and the film 31B may be separate components, and the space between the second casing 33B and the film 313 may be sealed by the above-explained second sealer 34B.

The frame 43A is to form the depressurizing room 40 together with the first casing 33A and the second casing 33B, and can be formed in, for example, a size abuttable with the first casing 33A, and in a cylindrical shape which can surround a portion of the second casing 33B facing with the first casing 33A. According to this structure, the frame 43A can be moved relative to the second casing 33B to form the depressurizing room 40. The depressurizing room 40 is to depressurizing an atmosphere at least between the first die 1A and the molding target 2 and between the second die 1B and the molding target 2. Hence, gases present between the first die 1A and the molding target 2 and between the second die 13 and the molding target 2 can be eliminated, allowing the first and second dies 1A, 1B and the molding target 2 to be uniformly depressed against each other at the time of molding. The material of the frame 43A is not limited to any particular one as long as it has the pressure resistance and the heat resistance under the molding condition in an imprinting process, and for example, a metal like stainless-steel is applicable.

In order to surely seal the depressurizing room 40, a depressurizing room sealer 44 to air-tightly seal a space between the frame 43A and the second casing 33B, and a space between the frame 43A and the first die 1A or the first casing 33A may be further provided. For example, as illustrated in FIG. 1, the depressurizing room sealer 34 that is an O-ring is prepared, a concave groove shallower than the diameter of the cross-section of the O-ring is formed in the first-casing-33A side of the frame 43A, and the O-ring can be disposed in this groove. In addition, a concave groove shallower than the diameter of the cross-section of the O-ring may be formed in the outer circumference (frame-43A side) of the second casing 33B, and the O-ring may be disposed in this groove. Needless to say, a concave groove shallower than the diameter of the cross-section of the O-ring may be formed in the frame-43A side of the first casing 33A, and the O-ring may be disposed in this groove, or a concave groove shallower than the diameter of the cross-section of the O-ring may be formed in the inner circumference (second-casing-33B side) of the frame 43A, and the O-ring may be disposed in this groove.

In the above explanation, the explanation was given of a case in which the depressurizing room 40 is formed by the first casing 33A, the second casing 33B, and the frame 43A, but any structure can be employed as long as gases present between the first die 1A and the molding target 2 and between the second die 1B and the molding target 2 can be eliminated, and for example, the first casing and the second casing may be disposed in a casing for a depressurizing room which can decrease the internal pressure thereof.

The first moving unit is not limited to any particular mechanism as long as it can move the first die 1A and the molding target 2 in a direction coming close to or becoming distant from each other. For example, the first casing 33A may be moved relative to the frame 43 where elastic force like a spring 46 is applied in a direction making the first die 1A and the molding target 2 distant from each other and caused to abut the frame, and the first die 1A may be held by the frame 43A and the first casing 33A. As to the movement of the first casing 33A, it is not illustrated in the figure but a hydraulic or pneumatic cylinder that moves the first casing, or a casing moving unit that is a combination of an electric motor and a ball screw may be applied. A structure of moving the frame itself by a hydraulic or pneumatic cylinder or by a combination of an electric motor and a ball screw without the use of a spring, etc., is also applicable.

In the above explanation, the frame 43A that forms the depressurizing room 40 is a common structure to the first moving unit, but this structure is not always necessary. For example, a first moving unit that is independent from the frame 43A may be additionally provided.

The second moving unit can be any structure as long as it can move the second die 1B and the molding target 2 in a direction coming close to or becoming distant from each other. For example, as illustrated in FIG. 1, a mount portion 43B on which the molding target 2 is mountable and to which elastic force like a spring is applied in a direction making the second die 1B and molding target 2 distant from each other may be provided, the first casing 33A may be moved relative to the mount portion 43B, and the mount portion 43B may be moved to the second-casing-33B side. The shape of the mount portion is not limited to any particular one as long as the molding target 2 or the molding target holder 25 is mountable, and for example, a cylindrical shape that supports the molding target 2 or the molding target holder 25 in a point-to-point contact manner at equal to or greater than three points. A hydraulic or pneumatic cylinder that moves the mount portion 43B or a combination of an electric motor and a ball screw that move the mount portion is applicable. When the second die 1B has a dimension that contacts the mount portion 43B, it is suitable if a hole where the mount portion 43B can be inserted is provided in the second die is. In this case, the second die 1B can be positioned relative to the mount portion 43B.

As explained above, when the first moving unit is structured so as to apply elastic force in a direction in which the first die 1A and the molding target 2 are becoming distant from each other, and the second moving unit is structured so as to apply elastic force in a direction in which the second die 1B and the molding target 2 are becoming distant from each other, and the first casing 33A and the second casing 33B are relatively moved against the elastic forces by the first and second moving units using the casing moving unit, if the first casing 33A and the second casing 33B are simply moved in a direction coming close to each other, the first die 1A and the second die 1B can be caused to intimately contact with the molding target 2. Hence, this structure is preferable in this point.

The pressurizer 35 is not limited to any particular mechanism as long as it can adjust the fluid pressure in the first pressurizing room 30A and in the second pressurizing room 30B up to a pressure that allows transfer of the mold patterns of the first die 1A and the second die 1B to the molding target 2. For example, a gas supply/discharge channel 351 may be connected with the first pressurizing room 33A and the second pressurizing room 33B, and gas, such as air or inert gas may be supplied to or discharged from the first and second pressurizing rooms 30A, 30B. In order to supply the gas, a gas supply source 352 that is an air compressor or a tank, etc., supplying compressed gas is applicable. In addition, the gas supply/discharge channel 351 is provided with an on-off valve 353A that opens/closes the first pressurizing room 30A, an on-off valve 353B that opens/closes the second pressurizing room 30B, and an on-off valve 355 that opens/closes the gas supply source 352. In order to discharge the gas, it is not illustrated but the gas can be discharged by opening/closing a degassing valve. Note that a safety valve may be provided as needed.

The depressurizer 45 is to depressurize the depressurizing room 40 formed between the first casing 33A and the second casing 33B, and to eliminate fluids present between the first die 1A and the molding target 2 and between the second die 1B and the molding target 2. Hence, the first die 1A and the second die 1B can surely intimately contact with the molding target 2 to transfer the mold patterns, thereby suppressing a transfer failure. The depressurizer 45 may include the gas supply/discharge channel 351 connected to the depressurizing room 40, and a depressurizing pump 452 that discharges gas in the depressurizing room 40 through the gas supply/discharge channel 451. In addition, the gas supply/discharge channel 351 is provided with an on-off valve 453 that opens/closes the depressurizing room 40, and an on-off valve 455 that opens/closes the depressurizing pump 452.

The pressure adjuster adjusts the pressures so as to reduce the pressure difference between the depressurizing room 40 and the first pressurizing room 30A, the second pressurizing room 30B. Hence, the first die 1A or the second die 1B is prevented from being deflected due to a pressure difference between the depressurizing room 40 and the first pressurizing room 30A, the second pressurizing room 30B, and the gases present between the first die 1A and the molding target 2 and between the second die 1B and the molding target 2 can be surely eliminated. An example pressure adjuster is a communication channel 47 that causes the depressurizing room 40 and the first pressurizing room 30A, and the depressurizing room 40 and the second pressurizing room 30B to be in communication with each other. Accordingly, the pressure difference between the depressurizing room 40 and the first pressurizing room 30A, the second pressurizing room 30B can be easily set to zero. As illustrated in FIG. 1, the communication channel may be common with the gas supply/discharge channel 351. Another example pressure adjuster employs a structure in which the pressure difference between the depressurizing room 40 and the first pressurizing room 30A, the second pressurizing room 30B is adjusted based on pressure sensors that detect respective pressures of the depressurizing room 40, and the first and second pressurizing rooms 30A, 30B, or the respective pressure differences.

It is preferable that the pressure adjuster is capable of reducing the pressure difference between the first pressurizing room 30A and the second pressurizing room 30B when the first and second dies 1A, 1B are depressed against the molding target 2, more preferably, of setting that pressure difference to be zero. Hence, non-uniform pressure applications to both surfaces of the molding target 2 can be prevented, and thus the molding target can be stably held between the first and second pressurizing rooms 30A, 30B.

It is not illustrated in the figure but the imprint device of the present disclosure may further include a temperature adjuster that adjusts the temperature of the molding target 2 by heating or cooling it. The temperature adjuster applicable is a heater or a cooler the directly or indirectly heats/cools the molding target 2.

The heater is not limited to any particular one as long as it can heat the molding target 2, the first die 1A or the second die 1B to a predetermined temperature, e.g., equal to or higher than the glass transition temperature or melting temperature of the molding target 2. In addition, the heater may heat the molding target 2 from the first-pressurizing-room-30A side or from the second-pressurizing-room-30B side, or, from both sides. More specifically, a radiant heat source, such as a ceramic heater or a halogen heater, that emits electromagnetic waves to perform heating may be provided in the first pressurizing room 30A or in the second pressurizing room 30B to heat the molding target 2 or the first and second dies 1A, 1B to be in contact therewith. The first die 1A and the second die 1B can be heated to a predetermined temperature using a heated gas supplied to the interiors of the first and second pressure adjusting rooms 30A, 30B.

The cooler is also not limited to any particular one as long as it can cool the molding target 2, the first die 1A, or the second die 1B to a predetermined temperature, e.g., lower than the glass transition temperature or melting temperature of the molding target 2. In addition, the cooler may cool the molding target 2 from the first-pressurizing-room-30A side or from the second-pressurizing-room-30B side. The first die 1A and the second die 1B can be cooled to a predetermined temperature using a cold gas supplied to the interiors of the first and second pressure adjusting rooms 30A, 30B.

When the imprint device of the present disclosure is applied to an optical imprinting process, it is not illustrated but is appropriate if a light source that emits electromagnetic waves with a predetermined wavelength to the molding target 2 is provided in the first pressurizing room 30A and in the second pressurizing room 30B.

Still further, a mold releaser that demolds the first die 1A and the second die 1B from the molding target 2 may be provided as needed. As to the mold releaser, conventionally well-known technologies are applicable.

Next, an explanation will be given of an imprint method of the present disclosure together with an operation of the imprint device thereof. The imprint method of the present disclosure is to transfer mold patterns on both surfaces of the molding target 2 using the flexible first and second dies 1A, 1B, and mainly includes an disposing process of forming the first pressurizing room 30A between the first casing 33A and the first die 1A, forming the second pressurizing room 30B between the second casing 33B and the second die 1B, and forming the depressurizing room 40 between the first die 1A and the molding target 2 and between the second die 1B and the molding target 2, an eliminating process of depressurizing the depressurizing room 40, the first pressurizing room 30A, and the second pressurizing room 30B to eliminate fluids present between the first die 1A and the molding target 2 and between the second die 1B and the molding target 2, an intimately contacting process of causing the first die 1A and the second die 1B to intimately contact the molding target 2, and a transferring process of pressurizing the first pressurizing room 30A and the second pressurizing room 30B to transfer the mold patterns of the first and second dies 1A, 1B to the molding target 2.

In the disposing process, first, the second die 1B is disposed on the second casing 33B so as not to contact the frame 43A and the mount portion 43B, thereby forming the second pressurizing room 30B. Next, with a space being formed between the molding target 2 and the second die 1B, the molding target 2 and the molding target holder 25 are mounted on the mount portion 43B. At this time, the molding target 2 and the molding target holder 25 are disposed so as not to contact the frame 43A. Next, the first die 1A is disposed on the frame 43A so as to have a space with the molding target 2, thereby forming the depressurizing room 40 between the first die 1A and the molding target 2 and between the second die 1B and the molding target 2

(see FIG. 1). Eventually, the first die 1A is held by the first casing 33A and the frame 43A, thereby forming the first pressurizing room 30A (see FIG. 2).

In the eliminating process, the depressurizing room 40 is depressurized to eliminate gases present between the first die 1A and the molding target 2 and between the second die 1B and the molding target 2. At this time, using the pressure adjuster, the first and second pressurizing rooms 30A, 30B are also depressurized to adjust the pressure difference between the depressurizing room 40 and the first and second pressurizing rooms 30A, 30B to a level that does not deform the first and second dies 1A, 1B. Preferably, the depressurizing room 40, the first pressurizing room 30A, and the second pressurizing room 30B are made to an equal pressure.

In the intimately contacting process, the first casing 33A and the second casing 33B are moved in a direction coming close to each other, and the frame 43A and the mount portion 43B are depressed against elastic forces to cause the first and second dies 1A, 1B to be superimposed on and intimately contact the molding target 2. After this operation, the depressurized first and second pressurizing rooms 30A, 30B are returned to the atmospheric pressure, thereby causing the first and second dies 1A, 1B to further intimately contact the molding target 2.

In the transferring process, the mold patterns of the first and second dies 1A, 1B are transferred to both surfaces of the molding target 2, respectively, through thermal imprinting or optical imprinting.

In a thermal imprinting, first, the molding target 2 is heated to a temperature equal to or higher than the glass transition temperature thereof by the heater, and the pressures of gases present in the first pressurizing room 30A and the second pressurizing room 30B are increased by the pressurizer. In this case, the first die 1A and the second die 1B are depressed against the molding target 2 by the gases in the first pressurizing room 30A and the second pressurizing room 30B, and the mold patterns are transferred to the molding target 2. Next, the molding target 2 is cooled to a temperature lower than the glass transition temperature by the cooler, and thus the mold patterns are fixed on the molding target 2 (see FIG. 3).

Conversely, in the case of an optical imprinting, the molding target 2 is heated by the heater as needed, and the pressures of gases present in the first pressurizing room 30A and the second pressurizing room 30B are increased by the pressurizer. In this case, the first die 1A and the second die 1B are depressed against the molding target 2 by the gases in the first pressurizing room 30A and the second pressurizing room 30B, and the mold patterns are transferred to the molding target 2. Next, the molding target 2 is irradiated with lights having a predetermined wavelength by the light source, and thus the mold patterns are fixed on the molding target 2 (see FIG. 3).

Thereafter, the first die 1A and the second die 1B are demolded from the molding target 2 (demolding process). The demolding process is not limited to any particular one as long as the first and second dies 1A, 1B can be released from the molding target 2, and conventionally well-known technologies are applicable.

It is to be understood that additional embodiments of the present invention described herein may be contemplated by one of ordinary skill in the art and that the scope of the present invention is not limited to the embodiments disclosed. While specific embodiments of the present invention have been illustrated and described, numerous modifications come to mind without significantly departing from the spirit of the invention, and the scope of protection is only limited by the scope of the accompanying claims.

REFERENCE SIGNS LIST

1A First die
1B Second die
2 Molding target
25 Molding target holder
30A First pressurizing room
30B Second pressurizing room
33A First casing
33B Second casing
34A First sealer
34B Second sealer
35 Pressurizer
40 Depressurizing room
43A Frame
44 Depressurizing room sealer
45 Depressurizer

The invention claimed is:

1. An imprint device that transfers mold patterns on both surfaces of a molding target using flexible first and second dies, wherein the molding target is disposed between the flexible first and second dies, the device comprising:
   a first casing for forming a first pressurizing room with the first die;
   a second casing for forming a second pressurizing room with the second die;
   a pressurizer that adjusts the pressure of the first pressurizing room and the pressure of the second pressurizing room;
   a first moving unit configured to move relative to the second casing so as to move the first die relative to the molding target in a direction coming close to or distant from each other, the first moving unit together with the first casing configured to hold the first die;
   a second moving unit that moves the second die relative to the molding target in a direction coming close to or distant from each other;
   a depressurizer that depressurizes a depressurizing room formed between the first die and the second die and eliminates fluids present between the first die and the molding target and between the second die and the molding target in a state which the first moving unit and the second moving unit are spaced apart from each other, the depressurizer communicating with the depressurizing room through the body of the first moving unit; and
   a pressure adjuster comprising a communication channel which provides communication between the depressurizing room, the first pressurizing room and the second pressurizing room, the pressure adjuster adjusting the pressure of the first pressurizing room and the pressure of the second pressurizing room so as to reduce pressure differences between the depressurizing room and the first pressurizing room and between the depressurizing room and the second pressurizing room when the depressurizing room is depressurized by the depressurizer.

2. The imprint device according to claim 1, wherein the pressure adjuster is capable of reducing a pressure difference between the first pressurizing room and the second pressurizing room when the first and second pressurizing rooms are pressurized.

3. The imprint device according to claim 1, wherein the first moving unit comprises a frame that surrounds an outer circumference of the second casing.

4. The imprint device according to claim 1, wherein:
the first moving unit applies elastic force in a direction in which the first die and the molding target become distant from each other;
the second moving unit applies elastic force in a direction in which the second die and the molding target become distant from each other; and
the imprint device further comprises a casing moving unit that moves the first casing and the second casing relative to each other against the elastic forces of the first moving unit and the second moving unit.

5. The imprint device according claim 1, further comprising a molding target holder that holds a circumference of the molding target,
wherein the second moving unit moves the molding target holder holding the molding target relative to the second casing.

6. The imprint device according to claim 1, further comprising a sealer that air-tightly seals a space between the first pressurizing room and the first die.

7. The imprint device according to claim 1, further comprising a sealer that air-tightly seals a space between the second pressurizing room and the second die.

8. The imprint device according to claim 1, further comprising a depressurizing room sealer that air-tightly seals an interior of the depressurizing room.

9. The imprint device according to claim 1, further comprising flexible films disposed between the first pressurizing room and the first die and between the second pressurizing room and the second die, respectively.

10. The imprint device according to claim 1, further comprising a temperature adjuster that adjusts a temperature of the molding target.

11. The imprint device according to claim 1, further comprising a light source that emits light to the molding target.

* * * * *